(12) United States Patent
Ganesan et al.

(10) Patent No.: US 10,006,967 B2
(45) Date of Patent: Jun. 26, 2018

(54) BATTERY MANAGEMENT SYSTEM FOR PREDICTING LIFE OF A RECONFIGURABLE BATTERY PACK

(71) Applicant: Samsung Electronics Co., Ltd., Suwon-si (KR)

(72) Inventors: Nandhini Ganesan, Bangalore (IN); Suman Basu, Bangalore (IN); Krishnan S Hariharan, Bangalore (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/295,056

(22) Filed: Oct. 17, 2016

(65) Prior Publication Data

US 2017/0108553 A1  Apr. 20, 2017

(30) Foreign Application Priority Data

Oct. 16, 2015 (IN) .......................... 5565/CHE/2015
Dec. 2, 2015 (IN) .......................... 5565/CHE/2015

(51) Int. Cl.
| | |
|---|---|
| *G08B 21/00* | (2006.01) |
| *G01R 31/36* | (2006.01) |
| *H02J 7/00* | (2006.01) |
| *G08B 21/18* | (2006.01) |
| *G08B 31/00* | (2006.01) |

(52) U.S. Cl.
CPC ..... *G01R 31/3679* (2013.01); *G01R 31/3651* (2013.01); *G01R 31/3658* (2013.01); *G01R 31/3682* (2013.01); *G08B 21/182* (2013.01); *G08B 31/00* (2013.01); *H02J 7/0021* (2013.01)

(58) Field of Classification Search
CPC ............ G01R 31/3679; G01R 31/3651; G08B 31/3648
USPC ..... 340/636.19, 636.15, 660, 661, 663, 438; 320/134, 162
See application file for complete search history.

(56) References Cited

U.S. PATENT DOCUMENTS

| | | |
|---|---|---|
| 8,146,694 B2 | 4/2012 | Hamidi |
| 8,362,749 B2 | 1/2013 | Komori et al. |
| 8,508,191 B2 | 8/2013 | Kim et al. |
| 2008/0054850 A1* | 3/2008 | Tae .......................... B60K 6/48 320/136 |
| 2010/0201328 A1* | 8/2010 | Monsive, Jr. ......... H02J 7/1415 320/162 |
| 2011/0148424 A1* | 6/2011 | Chiang .............. G01R 31/3624 324/427 |

(Continued)

FOREIGN PATENT DOCUMENTS

| | | |
|---|---|---|
| JP | 2007-55532 A | 3/2007 |
| JP | 2009-277627 A | 11/2009 |

(Continued)

*Primary Examiner* — Tai T Nguyen
(74) *Attorney, Agent, or Firm* — NSIP Law

(57) ABSTRACT

A method for predicting life of a reconfigurable battery pack, includes receiving a usage parameter of a reconfigurable battery pack, the battery pack comprising interconnected battery cells; identifying a State of Health (SOH) of degraded battery cells and a capacity of the reconfigurable battery pack; and determine a number of fresh battery cells to replace the degraded cells for the usage parameter based on the SOH and the capacity of the reconfigurable battery pack.

12 Claims, 8 Drawing Sheets

(56) References Cited

U.S. PATENT DOCUMENTS

| | | | | |
|---|---|---|---|---|
| 2012/0105069 A1* | 5/2012 | Wang | ................ | G01R 31/3679 |
| | | | | 324/427 |
| 2012/0274140 A1 | 11/2012 | Ganor | | |
| 2015/0260795 A1* | 9/2015 | Vinit | ................ | G01R 31/3679 |
| | | | | 324/426 |
| 2015/0323610 A1* | 11/2015 | Ahn | ....................... | H02J 7/007 |
| | | | | 320/152 |

FOREIGN PATENT DOCUMENTS

| | | |
|---|---|---|
| JP | 2014-11060 A | 1/2014 |
| KR | 10-2010-0101311 A | 9/2010 |
| KR | 10-2011-0006543 A | 1/2011 |
| KR | 10-2013-0130949 A | 12/2013 |
| KR | 10-2015-0037406 A | 4/2015 |
| KR | 10-2015-0049557 A | 5/2015 |

\* cited by examiner

BATTERY MANAGEMENT SYSTEM FOR PREDICTING LIFE OF A RECONFIGURABLE BATTERY PACK

CROSS-REFERENCE TO RELATED APPLICATION(S)

This application claims the benefit under 35 USC § 119(a) of Indian Patent Application Nos. 5565/CHE/2015, filed on Oct. 16, 2015, and 5565/CHE/2015, filed on Dec. 2, 2015, in the Indian Patent Office, the entire disclosures of which are incorporated herein by references for all purposes.

BACKGROUND

1. Field

The following description relates to a battery management system, and more particularly to a battery management system for predicting life of a reconfigurable battery pack.

2. Description of Related Art

Generally, a reconfigurable battery pack includes multi-battery modules, bus bars, fuses, and a safety circuitry system, which are combined into one large battery housing. The multi-battery modules are formed by rechargeable battery cells. To increase the power capability, the rechargeable battery cells are selectively connected in series or parallel according to the intended load, and the individual cells may be replaceable thereby forming the reconfigurable battery pack. As used herein, a "reconfigurable battery pack" is defined as a battery pack including a plurality of interconnected battery cells, where at least one of the battery cells is user-replaceable.

Further, the reconfigurable battery pack performance is limited by number of battery modules with the largest degradation, resulting in discarding of the pack. When any one of the batteries degrades, the entire battery pack may be unable to function for its intended purpose. Using a reconfigurable battery pack, one has the option to replace a dead module with a fresh or new module, and extend the life of the reconfigurable battery pack. In such circumstances, it would be beneficial to identify an optimal design criterion that effectively identifies and predicts the life of the reconfigurable battery pack.

Conventional methods and systems have been proposed for predicting life of the reconfigurable battery pack. Although the conventional methods and systems are somewhat effective, to a certain extent, for predicting the life of the reconfigurable battery pack, however such methods and systems include significant disadvantages in terms of hardware components used, controller power draw, manual steps required to be performed, time, cost, complexity, design, number of battery modules/cells involved, machine learning, premature battery cell discarding/waste, and so on.

Thus, it is desired to address the above mentioned disadvantages and/or other shortcomings to provide a useful alternative.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a method for predicting life of a reconfigurable battery pack includes receiving a usage parameter related to a reconfigurable battery pack, the battery pack including interconnected battery cells; identifying a State of Health (SOH) of degraded battery cells and a capacity of the reconfigurable battery pack; and reporting a determined number of fresh battery cells to replace the degraded cells for the usage parameter based on the SOH and the capacity of the reconfigurable battery pack.

The usage parameter may include any one or any combination of any two or more of a number of charge cycles of one or more of the battery cells, a capacity of one or more of the battery cells, a usage pattern of one or more of the battery cells, and a substantially optimal interval of the reconfigurable battery pack.

The usage parameter may include any one or any combination of any two or more of a time of a day, a day of a week, and a week of a month.

According to another general aspect, a method for predicting life of a reconfigurable battery pack includes identifying a capacity fade of one or more battery cells of a reconfigurable battery pack; determining a load deviation based on the capacity fade; calculating to determine a relationship between the load deviation and a threshold; and reporting a detected end of life of the reconfigurable battery pack in response to the calculating to determine the relationship of the load deviation relative to the threshold.

According to another general aspect, a method for predicting life of a reconfigurable battery pack includes identifying a load deviation of one or more battery cells of a reconfigurable battery pack; determining a capacity fade of the reconfigurable battery pack based on the load deviation; calculating to determine a relationship between the capacity fade and a threshold; and reporting a detected end of life of the reconfigurable battery pack in response to the calculating to determine the relationship of the capacity fade relative to the threshold.

According to another general aspect, a battery management system for predicting life of a reconfigurable battery pack, the battery management system including a controller configured to receive at least one usage parameter related to a reconfigurable battery pack comprising interconnected battery cells; identify a State of Health (SOH) of degraded battery cells and a capacity of the reconfigurable battery pack; and reporting a determined number of fresh battery cells to replace the degraded battery cells for the usage parameter based on the SOH and the capacity of the reconfigurable battery pack.

The usage parameter may include any one or any combination of any two or more of a number of charge cycles of one or more of the battery cells, a capacity of one or more of the battery cells, and a usage pattern of one or more of the battery cells of the reconfigurable battery pack.

The usage parameter may include any one or any combination of any two or more of a time of a day, a day of a week, a week of a month, and a substantially optimal interval of the reconfigurable battery pack.

According to another general aspect, a battery management system for predicting life of a reconfigurable battery pack, the battery management system includes a controller configured to: identify a capacity fade of one or more battery cells of a reconfigurable battery pack; determine a load deviation based on the capacity fade; calculate to determine a relationship between the load deviation and a threshold; and report a detected end of life of the reconfigurable battery pack based on the determined relationship between the load deviation and the threshold.

The controller may be further configured to identify either one or both of a State of Health (SOH) of one or more degraded battery cells and a number of battery cells of the reconfigurable battery pack.

The battery management system may further include a State of Health determiner coupled to the controller and configured to identify the either one or both of the State of Health of the one or more degraded battery cells and the number of battery cells of the reconfigurable battery pack.

The controller may be further configured to report the detected end of life of the reconfigurable battery pack in response to the load deviation approaching, meeting, or exceeding the threshold.

The battery management system may further include a communication unit coupled to the controller and configured to report the detected end of life of the reconfigurable battery pack in response to the load deviation approaching, meeting, or exceeding the threshold.

The controller may be further configured to report the detected end of life to any one or any combination of any two or more of a user, a load apparatus coupled to the reconfigurable battery pack, and an external battery management system coupled to the reconfigurable battery pack.

The controller may be further configured to actuate any one or any combination of any two or more of a wired datalink, a wireless datalink, a display, or a speaker to report any one or any combination of two or more of the detected end of life of one or more battery cells, the SOH of one or more battery cells, the number of battery cells, an identification of one or more degraded battery cells, and a recommended number of fresh battery cells to replace the degraded battery cells in the reconfigurable battery pack.

According to another general aspect, a battery management system for predicting life of a reconfigurable battery pack includes a controller configured to: identify a load deviation of one or more battery cells of a reconfigurable battery pack; determine a capacity fade based on the load deviation; determine a relationship between the capacity fade and a threshold; and report a detected end of life of the reconfigurable battery pack based on the determined relationship between the capacity fade and the threshold.

A non-transitory computer-readable storage medium may store instructions that, when executed by a processor, cause the processor to perform the method.

Other features and aspects will be apparent from the following detailed description, the drawings, and the claims.

Figure 1:
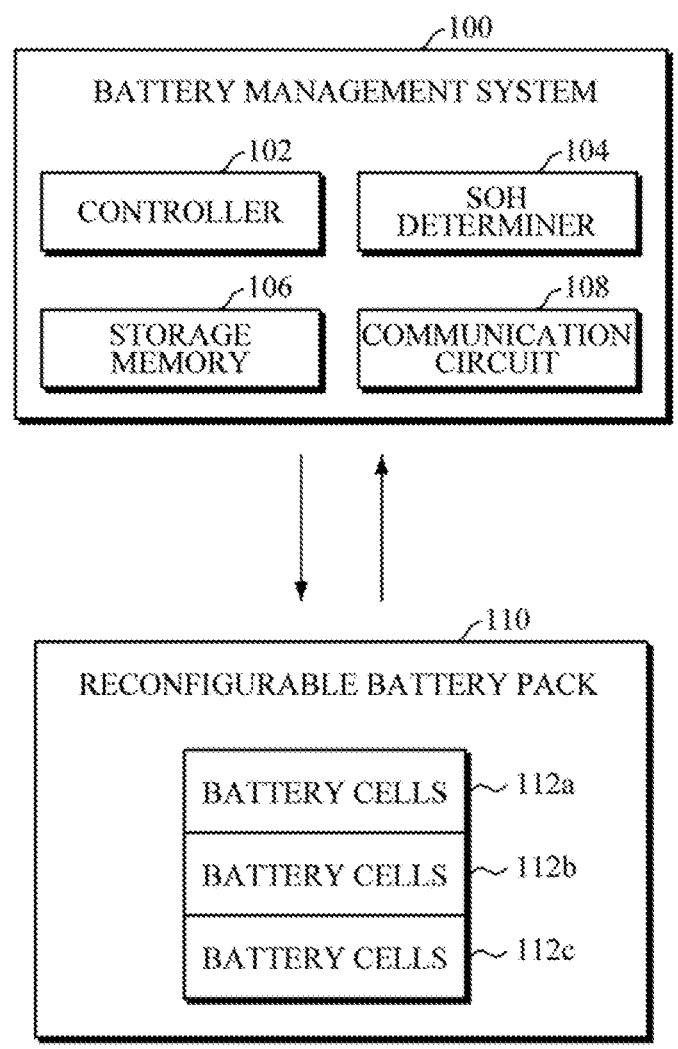
FIG. 1 is a schematic view of a battery management system for predicting and reporting an expected life of a reconfigurable battery pack, according to an embodiment.

Throughout the drawings and the detailed description, unless otherwise described, the same drawing reference numerals will be understood to refer to the same elements, features, and structures. The drawings may not be to scale, and the relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

The embodiments herein achieve a method for predicting and reporting an expected remaining life of a reconfigurable battery pack to a user, a load, an apparatus which manages the load, or a system which manages the battery pack. The method includes receiving a usage parameter. Further, the method includes identifying a State of Health (SOH) of degraded cells and current capacity of the reconfigurable battery pack. Furthermore, the method includes determining a number of fresh cells for the usage parameter based on the SOH and the current capacity of the reconfigurable battery pack.

The embodiments herein achieve a method for predicting life of a reconfigurable battery pack. The method includes identifying a SOH of degraded cells, a capacity fade, and a number of battery modules or cells of the reconfigurable battery pack. Further, the method includes determining a load deviation based on the capacity fade; and determining whether the load deviation is exceeding a threshold. Further, the method includes detecting an end of life of the reconfigurable battery pack when the load deviation exceeds the threshold.

The embodiments herein provide a method for predicting life of a reconfigurable battery pack. The method includes identifying a SOH of degraded cells, a load deviation, and a number of battery modules of the reconfigurable battery pack. Further, the method includes determining a capacity fade based on the load deviation; and determining whether the capacity fade is exceeding a threshold. Further, the method includes detecting an end of life of the reconfigurable battery pack when the capacity fade exceeds the threshold.

Unlike the conventional systems and methods, the proposed method and system is robust, reliable, and departs from the approaches heretofore seen to predict the life of the reconfigurable battery pack based on the relation between the load deviation, the SOH, the capacity fade and the pack configuration. The proposed method avoids overly complex computation seen in conventional systems and methods for predicting the life of the reconfigurable battery pack, but nonetheless, counterintuitively, arrives at reliable results. The proposed method can be used to design the reconfigurable battery pack based on a desired pack life and the current deviation or load deviation.

Unlike the conventional systems and methods, a substantially optimal design criterion of the reconfigurable battery pack is provided for substantially optimal estimation of the capacity fade of the reconfigurable battery pack without extensive user intervention. Thus, amongst other results, a minimum number of fresh cells, modules (or any portion of the plurality of cells that are combined to form the battery pack) that need to be replaced so as to extend the life of the reconfigurable battery pack in a cost effective manner is provided.

A substantially optimal estimation of the capacity fade of the reconfigurable battery pack is assessed, as it depends on the interaction between the fresh and aged modules in the reconfigurable battery pack. Thus, the proposed battery management system is used to estimate the pack capacity fade of the reconfigurable battery pack based on the load deviation without any overly complex computation such as the type in the conventional art. In such manner, the logic components in the BMS may be substantially reduced. Similarly, embedded processing resources in the BMS may be significantly reduced along with clock rate, voltage, and current.

Further, a ratio of fresh cell and aged cell is determined to predict the performance of the reconfigurable battery pack based on a load gradient. The ratio is used as an input parameter to aid a reconfigurable battery pack engineer to develop the reconfigurable battery pack with an extended life.

Further, the proposed method, according to one or more embodiments is implemented in an onboard Battery Management System (BMS) to predict and report the probable life of the reconfigurable battery pack under a standard discharge condition. The proposed method is applicable for any lithium ion (Li-ion) energy battery cells pack under any cycling conditions. The probable or expected life of the battery pack is reported to a user, a load apparatus, or an external management system such as a vehicle management system, via communication circuit 108 by visual, audio, electronically, or by other suitable indicia such as a loudspeaker, LED array, output wire such as USB, on board diagnostic (OBDII), or serial RS-232 port, Bluetooth, NFC, RFID, ZigBee, 4G, LTE, wireless LAN or Wifi data connection. In an electric vehicle, for example, the expected life, and/or other metrics may be reported to the user on a video display on the dashboard, or via a data connection to a mobile terminal such as a cellphone, tablet, laptop, smartwatch, head mounted display, smart glasses, or other suitable user interface proximate to the vehicle or remotely, for example, at a service center or dealership.

The applications of such battery management system include a Battery Electric Vehicle (BEV), a Hybrid Electric Vehicle (HEV), an Electric Vehicle (EV), a Plug-In Hybrid Electric Vehicle (PHEV), or any suitable load benefitting from reconfigurable battery packs including a plurality of interconnected cells.

FIG. 1 is schematic view of a battery management system 100 configured to predict and report the life of a reconfigurable battery pack 110, according to an embodiment. In an embodiment, the battery management system 100 includes a controller 102, a SOH determiner 104, a storage memory 106, and a communication circuit 108. The battery management system 100 communicates with the reconfigurable battery pack 110 through the communication circuit 108. In an embodiment, the reconfigurable battery pack 110 includes battery cells 112a, 112b, and 112c (Hereafter, label of the battery cells is 112 for convenience). For example, the reconfigurable battery pack 110 is placed at a bottom end of a vehicle or placed anywhere underneath of the vehicle. The reconfigurable battery pack 110 includes a plurality of battery modules each having the plurality of battery cells 112 located, for example, at a rear end of the vehicle. The reconfigurable battery pack 110 is used in the vehicle for supplying electric energy. The reconfigurable battery pack 110 is configured to be charged during a recuperative or regenerative braking phase, during infrastructure charging, or during solar trickle charging and to be discharged during phases of the vehicle propulsion or use of accessories. The reconfigurable battery pack 110 is formed by a pack of rechargeable battery cells 112 connected in series and/or parallel manner. In an example, the number of battery cells 112 in the reconfigurable battery pack 110 is equal to fifteen (i.e., n=15) in the battery modules. However, any number of battery cells 112 may be connected in series or parallel in the battery modules such as a 6S3P, 5S2P, 8S1P (where xSyP, x indicating the number of serially connected cells and y indicating the number of parallel connected cells) or other suitable configuration. The battery cells 112 of the reconfigurable battery pack 110 serve for storing energy in the form of electric charge.

In an embodiment, the SOH determiner 104 is configured to generate a value indicating the SOH of the reconfigurable battery pack 110 based on a difference between one or more of the resistance values of one or more of the cells and a corresponding set of one or more resistance values generated during a prior discontinuous charging of the reconfigurable battery pack 110. In an embodiment, the SOH determiner 104 alternatively or additionally determines the SOH based on an existing technique (e.g., applying mathematical equations, heuristic techniques or the like as would be known to one of skill in the art after gaining a thorough understanding of the detailed disclosure).

In an embodiment, the controller 102 is configured to receive one or more usage parameter(s) from a user, a load apparatus, or an external management system. The usage parameter is, for example, but is not limited to, a number of charge cycles of the battery cell 112, a capacity of the battery cell 112, a usage pattern of the battery cell 112, time of a day, a day of a week, a week of a month, and a substantially optimal interval of the reconfigurable battery pack 110.

Further, the controller 102 is configured to identify the SOH of the degraded cells, such as by actuation of the SOH determiner 104, and current capacity of the reconfigurable battery pack 110. In an embodiment, the SOH of the reconfigurable battery pack 110 is a metric relating to the battery's power and energy delivery capability. Based on the SOH and the current capacity of the reconfigurable battery pack 110, the controller 102 is configured, according to an embodiment, to determine the number of fresh cells for the usage parameter. After determining the number of fresh cells for the usage parameter, the controller 102 is configured to predict an expected life remaining of the reconfigurable battery pack 110. An expected life remaining indicates a number of charge-discharge cycles for the reconfigurable battery remaining where the discharging period includes a useful, non-zero capacity. In other words, the reconfigurable battery pack retains the capacity to store and deliver a substantial (or not insignificant) amount of charge. For example, the reconfigurable battery pack may be said to have remaining life if it is still capable of delivering an amount of charge approximately equal to a sum of the charge capacity of the battery cells.

In an example, if the user replaces the battery modules once per month, the battery management system 100 automatically indicates life of the reconfigurable battery pack 110 every month to the user. In that time, the battery management system 100 automatically indicates the number of fresh cells, number of degraded cells, and the current capacity of the reconfigurable battery pack 100 to the user. Based on the number of degraded cells, and the current capacity of the reconfigurable battery pack 100, the user is empowered to more intelligently decide to replace the degraded cells with fresh battery modules, so as to extend the life of the reconfigurable battery pack 110 in a cost effective way while also, in the aggregate, decreasing an amount of waste and heavy metals disposed in landfills, to reduce the impact on the environment.

In an embodiment, the controller 102 is configured to identify the SOH of the degraded battery cells 112, the capacity fade, and the number of battery modules of the reconfigurable battery pack 110. Further, the controller 102 is configured to determine the load deviation based on the capacity fade. Further, the controller 102 is configured to determine whether the load deviation is exceeding a predetermined threshold. In an embodiment, the threshold is defined by the user. In an embodiment, the threshold is automatically pre-configurable according to the usage pattern of the reconfigurable battery pack 110. In other words, controller 102 may keep a periodic or continuous tally in the storage memory 106 of such load deviation through normal operating conditions and automatically establish the load deviation threshold according to a mean, mode, median, lower-bound/minima expected result based on the history of the device (or similar devices). The controller 102 is configured to detect the end of life of the reconfigurable battery pack 110 when the load deviation meets or exceeds the threshold. In an example, if the user sets the threshold limit for load deviation as e.g. 85% or 0.85, then the controller 102 detects the end of life of the reconfigurable battery pack when the load deviation approaches, meets, or exceeds 85%. In an embodiment, the controller 102 is configured to operate as per a normal operation condition, if the load deviation is not exceeding the threshold. According to one or more embodiments, the controller 102 is configured to issue warnings to a user as the load deviation approaches the threshold (or ceases to not be near the threshold) through any available reporting measures (as described above) e.g. wireless or wired data link, audible, or visible indicia, or other suitable measures.

Consider a scenario for the end of life of the reconfigurable battery pack 110 is obtained based on the following factors:

Given the initial condition of the battery cell 112 (state of the degraded cells)

$$\text{Deviation Current } (cd) = (I - I_{mean})/I_{mean} \quad \text{(Equation 1)}$$

Where, I is an instantaneous current draw value, expressed in Amperes (Amps);

$I_{mean}$ is a normal or average current draw value;

Capacity fade estimation is performed by a post-characterization analysis. The post-characterization analysis is performed by using existing techniques. For example, after every 10 cycles, the reconfigurable battery pack 110 is subjected to 1C discharge, and capacity ($C_i$) is estimated, where $C_i$ may be expressed as e.g. AH.

$$\text{Capacity fade } (C_f) = (C_0 - C_i)/C_0 \quad \text{(Equation 2)}$$

Where $C_0$ is an initial capacity and $C_i$ is an instantaneous capacity.

In an embodiment, mathematical expression is derived between the current deviation and the capacity fade. The coefficients of this relation will, in turn, be functions of configuration (ratio of fresh/aged cells) and the initial degradation.

Assuming the relationship between the current deviation (CD) and the capacity fade to be, for example, a 3rd order polynomial:

$$CD = a_1 cf^3 + a_2 cf^2 + a_3 cf^3 + C \quad \text{(Equation 3)}$$

Where, coefficients $a_1$, $a_2$, $a_3$ and the constant C are a function of configuration (ratio of fresh/aged cells) and the initial degradation.

Based on the calculation, a substantially optimal interval is found where the aged modules are replaced with fresh ones and the reconfigurable battery pack 110 may continue to be used for substantially the same load conditions. The life of the reconfigurable battery pack 110 is thereby extended considerably if the aged modules are replaced with fresh module or aged/degraded cells are replaced with fresh cells.

In an embodiment, the controller 102 is configured to identify the SOH of the degraded cells, the load deviation, and the number of battery modules/cells of the reconfigurable battery pack 110. The controller 102 is configured to determine the capacity fade based on the load deviation. The controller 102 is configured to determine whether the capacity fade is exceeding the threshold. In an embodiment, the threshold is defined by the user. In an embodiment, the threshold is automatically pre-configurable by the usage pattern. The controller 102 is configured to detect the end of life of the reconfigurable battery pack when the capacity fade exceeds the threshold. In an example, if the user sets the threshold limit for charging/discharging as, for example, 20% or 0.2 capacity fade the controller 102 detects the end of life of the reconfigurable battery pack when the capacity fade exceeds 20%. In an embodiment, the controller 102 is configured to operate as per the normal operation condition if the capacity fade is not exceeding the threshold. In one or more embodiments, the controller 102 is configured (as discussed above) to provide warnings or indicia to a user, a load apparatus, or an external management system as the capacity fade approaches, meets, or exceeds the threshold (or ceases to be distant from the threshold).

In an embodiment, the storage memory 106 is configured to store information generated from a charging process, including an historical record of, for example, e.g. the battery pack temperature, current draw, voltage, resistance, and state of charge at different times (including changes in such operations characteristics over time). The storage memory 106 includes one or more computer-readable storage media. The storage memory 106 may include non-volatile storage elements. Examples of such non-volatile storage elements may include magnetic hard disc, optical discs, floppy discs, flash memories, or forms of electrically programmable memories (EPROM) or electrically erasable and programmable (EEPROM) memories. In addition, the storage memory 106 in one or more embodiments, is a non-transitory storage medium. The term "non-transitory" indicates that the storage medium is not embodied in a carrier wave or a propagated signal. However, the term "non-transitory" should not be interpreted that the storage memory 106 is non-movable. In some examples, the storage memory 106 is configured to store relatively large amounts of information for example, operational characteristics or metrics spanning a substantial length of time such as a day, week, month, or even a number of years. In certain examples, a non-transitory storage medium may store data that can, over time, change (e.g., in Random Access Memory (RAM) or cache). In an embodiment, the communication circuit 108 is configured for communicating internally between internal units and with external devices via one or more networks (as discussed above).

Although the above mentioned battery management system 100 is explained by considering the electro-chemical characteristic (i.e. lithium ion (Li-ion)) of the reconfigurable battery pack 110, it is to be understood to a person of ordinary skill in the art, after gaining a thorough understanding of the subject disclosure, that such BMS may be employed to predict the life of a reconfigurable battery pack 110 including battery cells 112 having various electro-chemical characteristics. The battery cell can also include, for example, but is not limited to a lithium ion polymer (Li-ion polymer) battery cell, a nickel cadmium battery cell, a nickel hydrogen battery cell, a lithium (Li) battery cell with nickel (Ni) based cathode, a nickel cobalt aluminum (NCA) battery cell, a nickel zinc battery cell, or other suitable battery chemistry.

The FIG. 1 shows the limited overview of the battery management system 100 but, it is to be understood that other embodiments are not limited thereto. Further, the battery management system 100 includes any number of hardware or software components communicating with each other. By way of illustration, both an application running on a device and the device itself can be a component.

Figure 2:
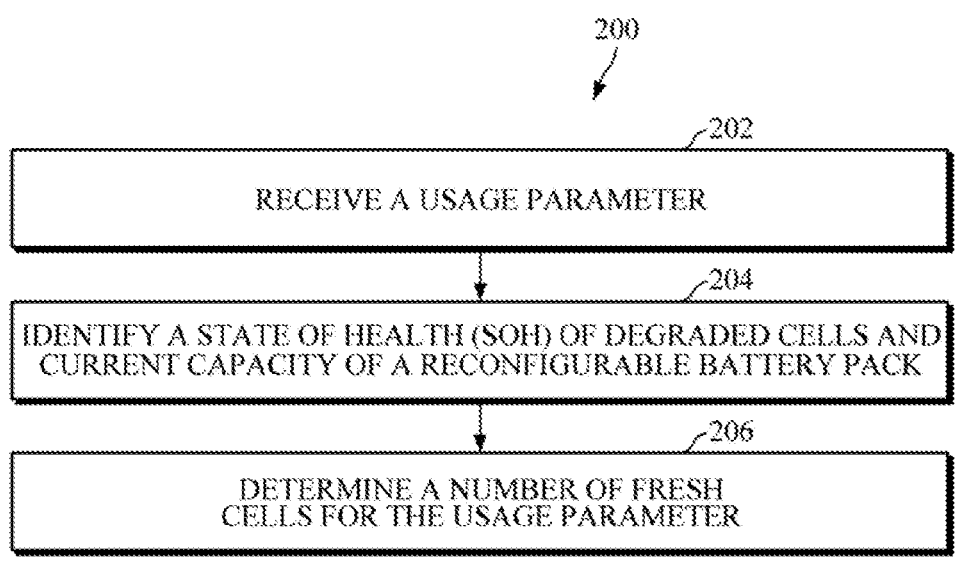
FIG. 2 is a flow diagram illustrating a method for predicting life of a reconfigurable battery pack based on a State of Health (SOH) and a current capacity of the reconfigurable battery pack, according to an embodiment.

FIG. 2 is a flow diagram illustrating a method 200 for predicting life of the reconfigurable battery pack 110 based on the SOH and the current capacity of the reconfigurable battery pack 110, according to an embodiment. The method (202 to 206) is performed by using the controller 102. The controller 102 is operated with a microcontroller, a microprocessor, logic components such as AND, OR, NOR gates interconnected in an Application Specific Integrated Circuit (ASIC), Field Programmable Gate Array (FPGA) or other suitable hardware (as discussed more thoroughly below), or any computer readable storage medium in the battery management system 100. At 202, the method 200 includes receiving one or more usage parameter(s). The usage parameter is, for example but is not limited to, a number of charge cycles of the battery cell 112, a capacity of the battery cell 112, a usage pattern of the battery cell 112, time of a day, a day of a week, a week of a month, and a substantially optimal interval of the reconfigurable battery pack 110. At 204, the method 200 includes identifying the SOH of the degraded cells and the current capacity of the reconfigurable battery pack 110. At 206, the method 200 includes determining the number of fresh cells for the usage parameter based on the SOH and the current capacity of the reconfigurable battery pack 110.

In an example, if the user replaces the battery modules after about 90 percent discharge cycles of the battery cells 112, the battery management system 100 automatically indicates life of the reconfigurable battery pack 110 after about 90 percent discharge cycles of the battery cell 112 to the user. At that time, the battery management system 100 automatically indicates the number of fresh cells, number of degraded cells, and current capacity of the reconfigurable battery pack 100 to the user. Based on the number of degraded cells, and the current capacity of the reconfigurable battery pack 100, the user replaces the degraded cells with the fresh battery modules, so as to extend the life of the reconfigurable battery pack 110.

The various actions represented by blocks, in the method 300 may be performed in the order presented, in a different order, or simultaneously. Further, in some embodiments, some of the actions may be omitted, added, modified, skipped, or the like without departing from the scope of the invention.

Figure 3:
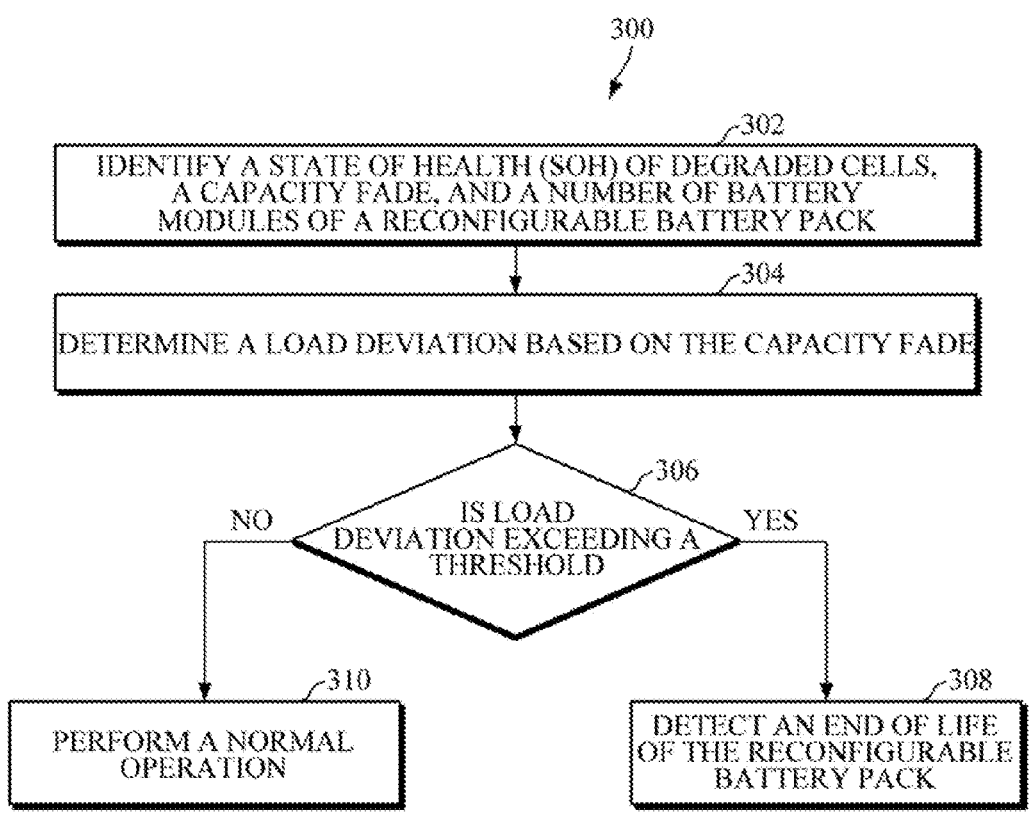
FIG. 3 is a flow diagram illustrating a method for predicting life of a reconfigurable battery pack based on a load deviation, according to an embodiment.

FIG. 3 is a flow diagram illustrating a method 300 for predicting life of the reconfigurable battery pack 100 based on the load deviation, according to an embodiment, as disclosed herein. The sequence blocks (302 to 310) is performed by using the controller 102. The controller 102 is operated with the microcontroller, the microprocessor, or any computer readable storage medium in the battery management system 100. At 302, the method 300 includes identifying the SOH of the degraded cells, the capacity fade, and the number of battery modules of the reconfigurable battery pack 110. At 304, the method 300 includes determining the load deviation based on the capacity fade. At 306, the method 300 includes determining whether the load deviation is exceeding, meeting, or approaching the threshold. In an embodiment, the threshold is defined by the user. In an embodiment, the threshold is automatically pre-configurable by the usage pattern, history, or based on thresholds established for similar configurations. If the load deviation is exceeding the threshold then, at 308, the method includes detecting the end of life of the reconfigurable battery pack 100. If the load deviation is not exceeding the threshold then, at 308, the method is operated as per the normal operation condition.

The method 300 is provided such that substantially all battery modules or cells are used approximately equally to balance the load of the reconfigurable battery pack 100, so that the load deviation is used as an indicator for the fade estimation. This results in an accurate prediction of life of the reconfigurable battery pack 100 without excessive user intervention or overly complex computation.

The various actions in the method 300 may be performed in the order presented, in a different order or simultaneously. Further, in some embodiments, some of the actions may be omitted, added, modified, skipped, or the like without departing from the scope of the invention.

Figure 4:
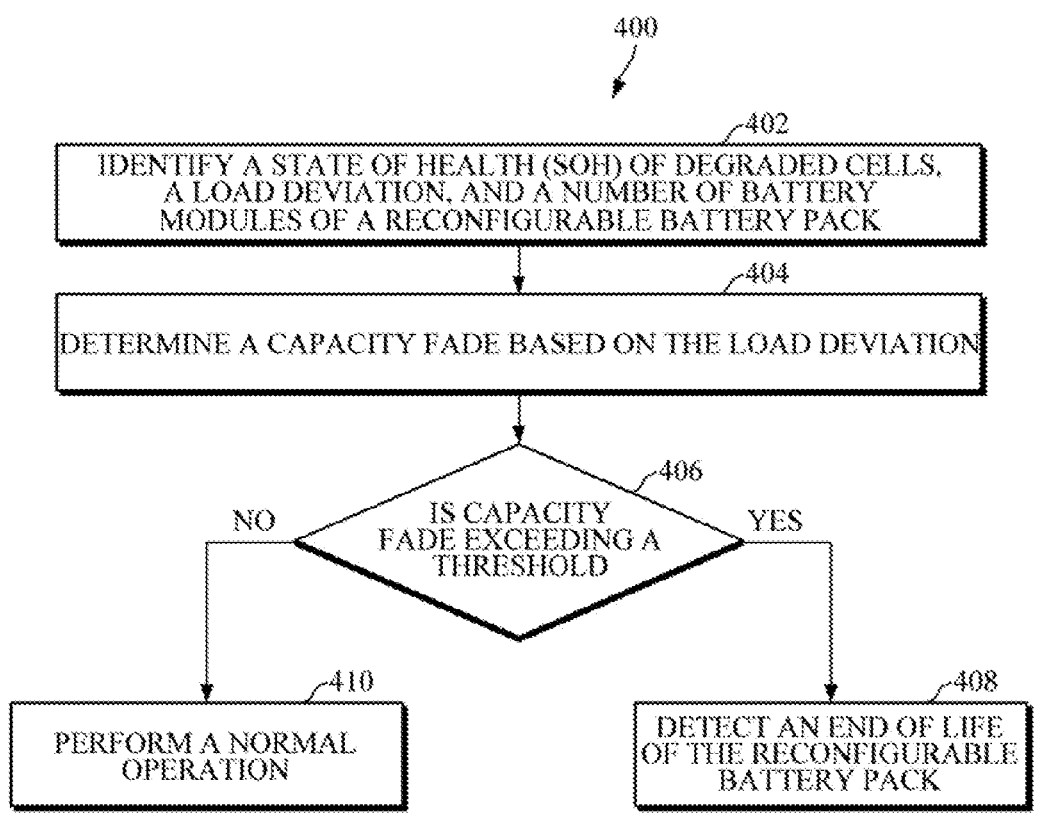
FIG. 4 is a flow diagram illustrating a method for predicting life of a reconfigurable battery pack based on a capacity fade, according to an embodiment.

FIG. 4 is a flow diagram illustrating the method 400 for predicting life of the reconfigurable battery pack 100 based on the capacity fade, according to an embodiment as disclosed herein. The sequence of blocks 402 to 410 is performed using the controller 102. The controller 102 is operated with the microcontroller, the microprocessor, and/or any computer readable storage medium in the battery management system 100. At step 402, the method includes identifying the SOH of the degraded cells, the load deviation, and the number of battery modules or cells of the reconfigurable battery pack 110. At 404, the method includes determining the capacity fade based on the load deviation. At 406, the method includes determining whether the capacity fade is exceeding the threshold. In an embodiment, the threshold is defined by the user. In an embodiment, the threshold is automatically pre-configurable by the usage pattern. If the capacity fade is exceeding the threshold, then the method at 408 includes detecting the end of life of the reconfigurable battery pack. If the capacity fade is not exceeding the threshold, then the method 410 is operated as per the normal operation condition.

The method 400 is provided such that substantially all battery modules are used about equally to balance the load of the reconfigurable battery pack 100, so that the capacity fade is used as the indicator for the fade estimation. This results in predicting life of the reconfigurable battery pack 100 without any excessive user intervention or any overly complex computation.

The various actions in the method 400 are performed in the order presented, in a different order, or simultaneously. Further, in some embodiments, some of the actions may be omitted, added, modified, skipped, or the like without departing from the scope of the invention.

Figure 5:
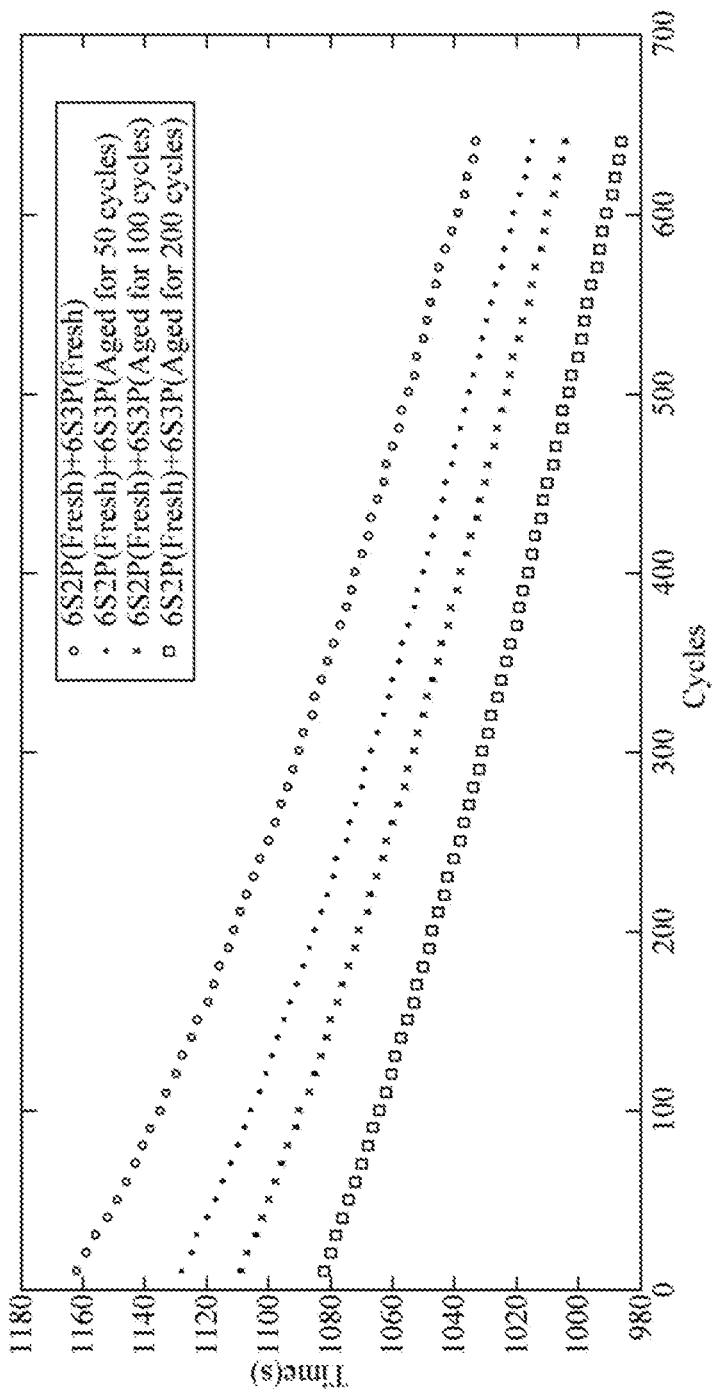
FIG. 5 is a graph showing a cycle time versus number of cycles for a reconfigurable battery pack, where one battery cell of the reconfigurable battery pack is aged to different levels, and other battery cells of the reconfigurable battery pack are fresh cells, according to an embodiment.

FIG. 5 is a graph depicting a cycle time versus number of cycles for the reconfigurable battery pack 110, where one or more battery cell 112 of the reconfigurable battery pack 110 is aged to a substantially different level relative to other cells, and other battery cells 112 of the reconfigurable battery pack 110 are fresh cells, according to an embodiment as disclosed herein. A 6S5P pack, for example, is simulated using an electrochemical model taking into account the degradation mechanisms at electrodes. The reconfigurable battery pack 110 is configured in different forms (e.g. 4S5P+2S5P, 2S5P+4S5P, 3S5P+3S5P). In an embodiment, the various configurations are then cycled with one of the cells always held at the same initial SOH. In an embodiment, this pack 110 is then cycled with one of the cells held each time at various levels of aging.

Figure 6:
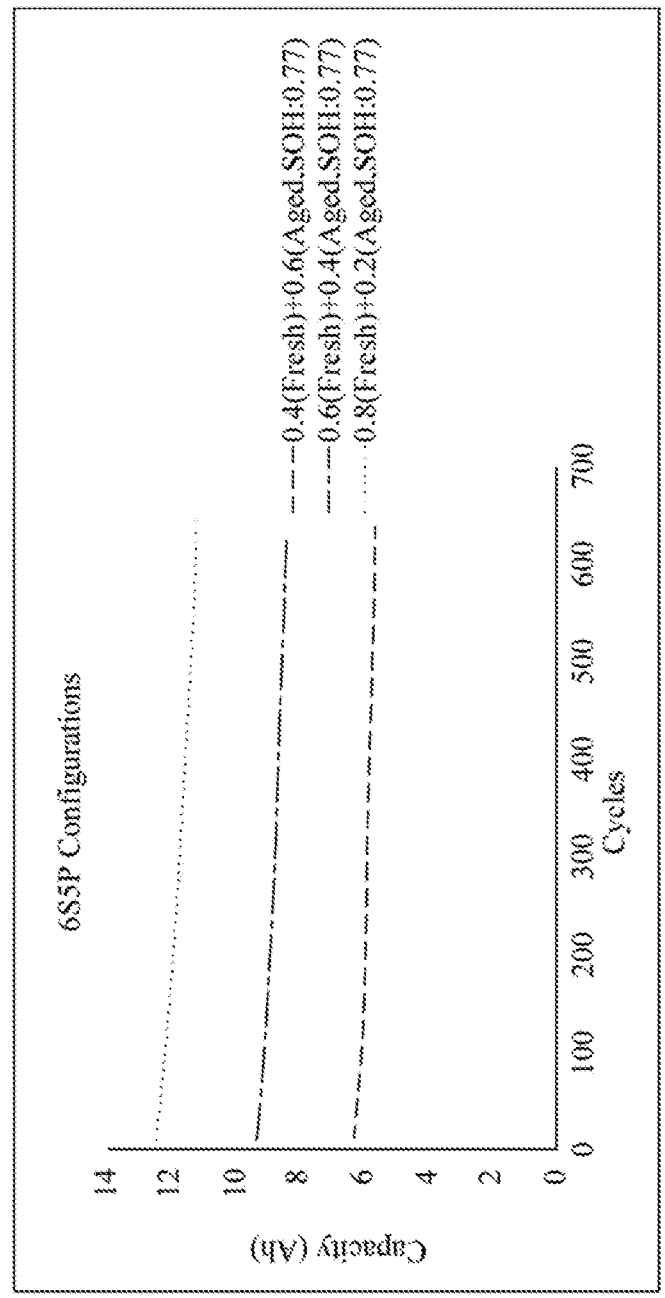
FIG. 6 is a graph showing a capacity versus cycles for different combinations of a reconfigurable battery pack where the initial state of degradation of the aged module is kept the same, according to an embodiment.
Figure 7:
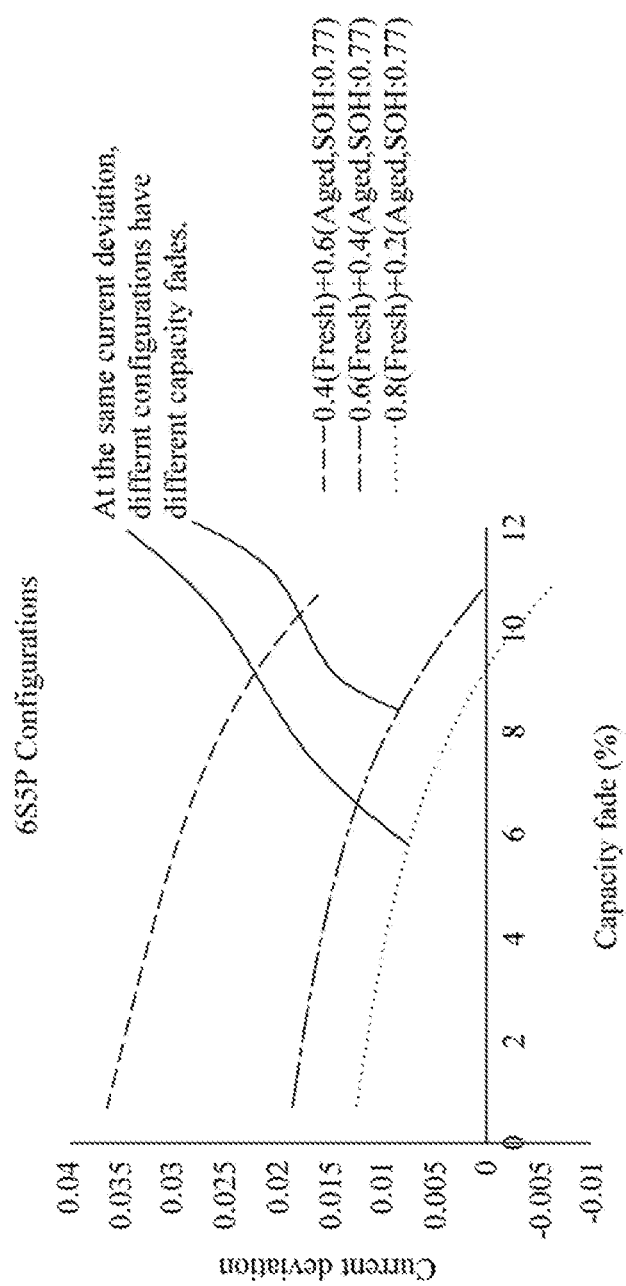
FIG. 7 is a graph showing a current deviation versus a capacity fade for different configurations of a reconfigurable battery pack where the initial degradation of the aged module is kept the same, according to an embodiment.

FIG. 6 is a graph depicting a capacity versus cycles for different combinations of the reconfigurable battery pack 110 where the initial state of degradation of the aged module is kept the same, according to an embodiment as disclosed herein. FIG. 7 is a graph depicting a current deviation versus a capacity fade for different configurations of the reconfigurable battery pack 110 where the initial degradation of the aged module is kept the same, according to an embodiment as disclosed herein. In the FIGS. 6 and 7, the 6S5P pack is simulated using an electrochemical model taking into account the degradation mechanisms at electrodes. The reconfigurable battery pack 110 is configured in different forms (4S5P+2S5P, 2S5P+4S5P, 3S5P+3S5P). The various configurations are then cycled with one of the modules always held at the same initial SOH. As shown in the FIG. 7, at the same current deviation, different configurations have different capacity fades. For example, for a configuration having about 0.4 (or 40% or approximately 4 out of every 10) fresh cells and about 0.6 (60%) aged cells at an SOH of about 0.77, the capacity fade is different when compared with a configuration having about 0.6 fresh cells and about 0.4 aged cells at an SOH of about 0.77. Similarly, for a configuration having about 0.4 fresh cells and about 0.6 aged cell at an SOH of about 0.77, the capacity fade is different when compared with a configuration having about 0.8 fresh cells and about 0.2 aged cells at an SOH of about 0.77.

Figure 8:
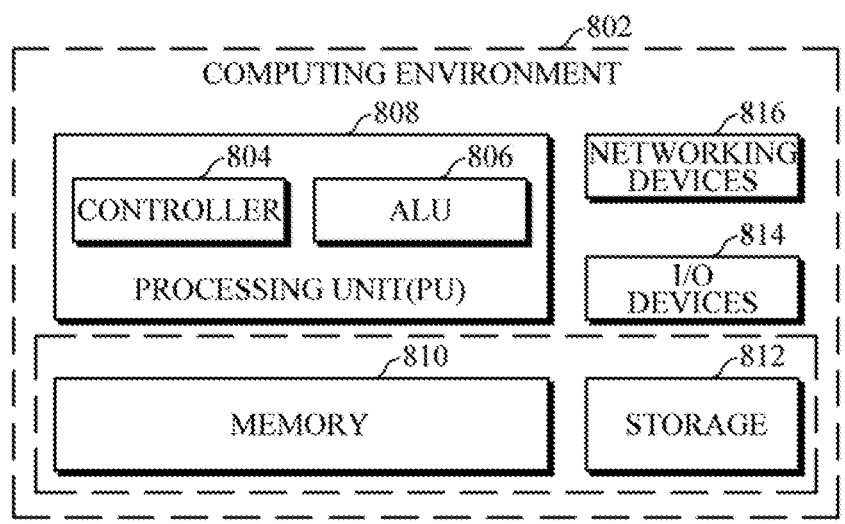
FIG. 8 illustrates a computing environment implementing a mechanism for predicting life of a reconfigurable battery pack, according to an embodiment.

FIG. 8 illustrates a computing environment 802 implementing a mechanism for predicting life of the reconfigurable battery pack 110, according to an embodiment as disclosed herein. As depicted in the figure, the computing environment 802 comprises at least one processing unit 808 that is equipped with a controller 804, an Arithmetic Logic Unit (ALU) 806, a memory 810, a storage memory 812, a plurality of networking devices 816 and a plurality Input output (I/O) devices 814. The processing unit 808 is responsible for processing instructions. The processing unit 808 receives commands from the controller 804 in order to perform its processing. Further, any logical and arithmetic operations involved in the execution of the instructions are computed with the help of the ALU 806.

The overall computing environment 802 may be composed of multiple homogeneous or heterogeneous cores, multiple CPUs of different kinds, special media and other accelerators. Further, the plurality of processing units 804 may be located on a single chip or over multiple chips.

The technique instructions and codes required for the implementation are stored in either the memory 810 or the storage 812 or both. At the time of execution, the instructions may be fetched from the corresponding memory 810 or storage 812, and executed by the processing unit 808.

According to one or more embodiments, various networking devices 816 or external I/O devices 814 are connected to the computing environment 802 to support the implementation through the networking devices 814 and/or the I/O device unit 814.

The embodiments disclosed herein may, according to one or more embodiments, be implemented through at least one software program running on at least one hardware device and performing management functions to control the elements. The elements shown in the FIGS. 1 to 8 include blocks, elements, actions, and/or acts which may be at least one of a hardware device, or a combination of hardware device and software.

The controller 102, SOH determiner 104, and communication circuit 108 in FIG. 1 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-4 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMS, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for predicting life of a reconfigurable battery pack, the method comprising:
    identifying a capacity fade of one or more battery cells of a reconfigurable battery pack;
    determining a load deviation based on the capacity fade;
    calculating a relationship between the load deviation and a threshold; and
    detecting an end of life of the reconfigurable battery pack in response to the calculating of the relationship of the load deviation relative to the threshold.

2. A non-transitory computer-readable storage medium storing instructions that, when executed by a processor, cause the processor to perform the method of claim 1.

3. A method for predicting life of a reconfigurable battery pack, the method comprising:
identifying a load deviation of one or more battery cells of a reconfigurable battery pack;
determining a capacity fade of the reconfigurable battery pack based on the load deviation;
calculating a relationship between the capacity fade and a threshold; and
detecting an end of life of the reconfigurable battery pack in response to the calculating of the relationship of the capacity fade relative to the threshold.

4. A non-transitory computer-readable storage medium storing instructions that, when executed by a processor, cause the processor to perform the method of claim 3.

5. A battery management system for predicting life of a reconfigurable battery pack, the battery management system comprising:
a controller configured to:
identify a capacity fade of one or more battery cells of a reconfigurable battery pack;
determine a load deviation based on the capacity fade;
calculate to determine a relationship between the load deviation and a threshold; and
detect an end of life of the reconfigurable battery pack based on the determined relationship between the load deviation and the threshold.

6. The battery management system of claim 5, wherein the controller is further configured to identify either one or both of a State of Health (SOH) of one or more degraded battery cells and a number of battery cells of the reconfigurable battery pack.

7. The battery management system of claim 6, further comprising a SOH determiner coupled to the controller and configured to identify the either one or both of the SOH of the one or more degraded battery cells and the number of battery cells of the reconfigurable battery pack.

8. The battery management system of claim 7, wherein the controller is further configured to report the detected end of life of the reconfigurable battery pack in response to the load deviation approaching, meeting, or exceeding the threshold.

9. The battery management system of claim 8, further comprising a communication circuit coupled to the controller and configured to report the detected end of life of the reconfigurable battery pack in response to the load deviation approaching, meeting, or exceeding the threshold.

10. The battery management system of claim 9, wherein the controller is further configured to actuate the communication circuit to report the detected end of life to any one or any combination of any two or more of a user, a load apparatus coupled to the reconfigurable battery pack, and an external battery management system coupled to the reconfigurable battery pack.

11. The battery management system of claim 10, wherein the communication circuit is further configured to actuate any one or any combination of any two or more of a wired datalink, a wireless datalink, a display, or a speaker to report any one or any combination of two or more of the detected end of life of one or more battery cells, the SOH of one or more battery cells, the number of battery cells, an identification of one or more degraded battery cells, and a recommended number of fresh battery cells to replace the degraded battery cells in the reconfigurable battery pack.

12. A battery management system for predicting life of a reconfigurable battery pack, the battery management system comprising:
a controller configured to:
identify a load deviation of one or more battery cells of a reconfigurable battery pack;
determine a capacity fade based on the load deviation;
determine a relationship between the capacity fade and a threshold; and
report a detected end of life of the reconfigurable battery pack based on the determined relationship between the capacity fade and the threshold.

* * * * *